(12) United States Patent
Lu et al.

(10) Patent No.: US 10,073,933 B2
(45) Date of Patent: Sep. 11, 2018

(54) AUTOMATIC GENERATION OF PROPERTIES TO ASSIST HARDWARE EMULATION

(71) Applicant: Synopsys, Inc., Mountain View, CA (US)

(72) Inventors: Yuan Lu, Saratoga, CA (US);
Lawrence Vivolo, San Jose, CA (US);
Nitin Mhaske, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/682,301

(22) Filed: Aug. 21, 2017

(65) Prior Publication Data

US 2017/0344681 A1 Nov. 30, 2017

Related U.S. Application Data

(63) Continuation of application No. 14/928,977, filed on Oct. 30, 2015, now Pat. No. 9,760,663.

(60) Provisional application No. 62/072,986, filed on Oct. 30, 2014.

(51) Int. Cl.
*G06F 17/50* (2006.01)

(52) U.S. Cl.
CPC ........ *G06F 17/5027* (2013.01); *G06F 17/504* (2013.01); *G06F 17/5009* (2013.01); *G06F 17/5081* (2013.01); *G06F 17/5045* (2013.01)

(58) Field of Classification Search
CPC ............. G06F 17/5027; G06F 17/5081; G06F 17/5009; G06F 17/504; G06F 17/5045
See application file for complete search history.

(56) References Cited

U.S. PATENT DOCUMENTS

| 5,754,827 | A | 5/1998 | Barbier | |
|---|---|---|---|---|
| 6,484,134 | B1 | 11/2002 | Hoskote | |
| 6,678,645 | B1* | 1/2004 | Rajsuman | G06F 17/5022 703/14 |
| 6,708,322 | B2* | 3/2004 | Ito | G06F 17/5045 714/30 |
| 6,832,359 | B2 | 12/2004 | Abe et al. | |
| 7,263,478 | B2 | 8/2007 | Tsuchiya | |
| 7,366,652 | B2* | 4/2008 | Wang | G06F 17/5027 703/21 |

(Continued)

FOREIGN PATENT DOCUMENTS

WO WO 2007/020602 A2 2/2007

OTHER PUBLICATIONS

U.S. Appl. No. 13/672,537, filed Nov. 8, 2012, Inventor Yuan Lu et al., [copy not enclosed].

(Continued)

*Primary Examiner* — Naum B Levin
(74) *Attorney, Agent, or Firm* — Fenwick & West LLP

(57) ABSTRACT

Analysis of a first verification test suite automatically generates properties that may be directly used in a subsequent verification test suite. For example, an IP module may be verified by executing a software simulation test suite. The resulting data is accessed and analyzed to detect a set of properties of the software simulation test suite. A set of emulator-synthesizable properties are selected from the set of detected properties. The emulator-synthesizable properties are suitable for incorporation in a hardware emulation test suite used to test the SoC.

21 Claims, 4 Drawing Sheets

(56) References Cited

U.S. PATENT DOCUMENTS

| | | | |
|---|---|---|---|
| 7,386,813 B2 * | 6/2008 | Singh | G06F 17/5009 716/103 |
| 7,404,160 B2 * | 7/2008 | Piper | G06F 17/5081 716/106 |
| 7,512,728 B2 * | 3/2009 | Tseng | G06F 13/22 709/236 |
| 7,712,059 B1 | 5/2010 | Du et al. | |
| 7,712,060 B1 * | 5/2010 | Garg | G06F 17/504 703/16 |
| 7,810,056 B1 * | 10/2010 | Garg | G06F 17/505 716/104 |
| 7,926,020 B1 * | 4/2011 | Lu | G06F 17/5045 716/136 |
| 7,930,130 B2 | 4/2011 | Sakarovitch et al. | |
| 8,020,124 B2 * | 9/2011 | Alexanian | G01R 31/31831 716/100 |
| 8,024,691 B2 * | 9/2011 | Zilic | G06F 17/504 703/14 |
| 8,037,002 B2 | 10/2011 | Imai et al. | |
| 8,127,261 B2 * | 2/2012 | Auerbach | G06F 8/34 714/46 |
| 8,161,439 B2 * | 4/2012 | Lim | G06F 17/5027 716/106 |
| 8,166,430 B2 | 4/2012 | Bormann et al. | |
| 8,214,195 B2 | 7/2012 | Durand et al. | |
| 8,214,782 B1 | 7/2012 | Chakraborti et al. | |
| 8,219,376 B2 | 7/2012 | Pidan et al. | |
| 8,219,947 B2 | 7/2012 | Bist et al. | |
| 8,271,918 B2 | 9/2012 | Kwok et al. | |
| 8,413,088 B1 * | 4/2013 | Armbruster | G06F 17/5022 716/100 |
| 8,443,316 B1 | 5/2013 | Biswas et al. | |
| 8,479,069 B2 * | 7/2013 | Miller | G06F 11/221 370/254 |
| 8,495,536 B2 | 7/2013 | Fan et al. | |
| 8,516,421 B1 | 8/2013 | Ben-Tzur | |
| 8,527,921 B2 | 9/2013 | Cerny et al. | |
| 8,527,936 B2 | 9/2013 | Jain et al. | |
| 8,543,953 B2 | 9/2013 | Boehm | |
| 8,548,936 B2 | 10/2013 | Iwamasa | |
| 8,560,985 B1 | 10/2013 | Sahu et al. | |
| 8,572,527 B1 | 10/2013 | Coelho, Jr. et al. | |
| 8,584,247 B1 | 11/2013 | Patil | |
| 8,589,884 B2 | 11/2013 | Gorthi et al. | |
| 8,689,155 B1 | 4/2014 | Galpin | |
| 8,701,060 B2 | 4/2014 | Brinkmann | |
| 8,706,469 B2 | 4/2014 | Beausoleil et al. | |
| 8,719,799 B2 | 5/2014 | Adler et al. | |
| 8,726,224 B1 * | 5/2014 | Giangarra | G06F 17/5036 716/132 |
| 8,781,808 B2 * | 7/2014 | Yang | G06F 17/5022 703/13 |
| 9,021,409 B2 * | 4/2015 | Vasudevan | G06F 17/504 716/106 |
| 9,075,935 B2 * | 7/2015 | Vasudevan | G06F 17/50 |
| 9,135,382 B1 * | 9/2015 | Lu | G06F 17/5022 |
| 9,189,578 B1 * | 11/2015 | Giangarra | G06F 17/5045 |
| 9,495,504 B2 * | 11/2016 | Auerbach | G06F 17/5022 |
| 9,760,663 B2 * | 9/2017 | Lu | G06F 17/5027 |
| 2003/0046668 A1 * | 3/2003 | Bowen | G06F 17/5045 717/131 |
| 2004/0078674 A1 * | 4/2004 | Raimi | G06F 17/504 714/33 |
| 2007/0005322 A1 * | 1/2007 | Patzer | G01R 31/31835 703/14 |
| 2007/0219771 A1 * | 9/2007 | Verheyen | G06F 11/261 703/15 |
| 2010/0070937 A1 | 3/2010 | Nishide | |
| 2011/0161898 A1 * | 6/2011 | Chauhdry | G06F 17/504 716/103 |
| 2011/0184713 A1 * | 7/2011 | Yang | G06F 17/5022 703/13 |
| 2013/0019216 A1 * | 1/2013 | Vasudevan | G06F 17/504 716/106 |
| 2013/0024178 A1 * | 1/2013 | Kumaragurunathan | G06F 17/5027 703/14 |
| 2015/0006133 A1 * | 1/2015 | Abramovitch | G06F 17/5009 703/2 |
| 2015/0242541 A1 * | 8/2015 | Cerny | G06F 17/504 716/106 |
| 2016/0098505 A1 * | 4/2016 | Larzul | G06F 17/5027 703/15 |

OTHER PUBLICATIONS

Hwu, W-M. et al., "Program Decision Logic Optimization Using Predication and Control Speculation," Proceedings of the IEEE, Nov. 2001, pp. 1660-1674, vol. 89, No. 11.

United States Office Action, U.S. Appl. No. 14/928,977, dated Dec. 27, 2016, 9 pages.

* cited by examiner

AUTOMATIC GENERATION OF PROPERTIES TO ASSIST HARDWARE EMULATION

CROSS-REFERENCE TO RELATED APPLICATION(S)

This application is a continuation of U.S. patent application Ser. No. 14/928,977, "Automatic Generation of Properties to Assist Hardware Emulation," filed Oct. 30, 2015 now U.S. Pat. No. 9,760,663; which claims priority under 35 U.S.C. § 119(e) to U.S. Provisional Patent Application Ser. No. 62/072,986, "A System and Method for Generating Properties to Assist Emulation Debug," filed Oct. 30, 2014. The subject matter of all of the foregoing is incorporated herein by reference in their entirety.

BACKGROUND

1. Field of the Invention

This disclosure relates generally to verification of integrated circuit designs.

2. Description of Related Art

Designers continue to develop integrated circuits of ever increasing complexity using more and more transistors. Verifying the behavior of a design of electronic circuitry has becoming increasingly difficult and time-consuming. One verification method is software simulation. Software is programmed to perform the same function as the design under test. Verification tests are then run against the software simulator to determine whether the current design functions as desired. A considerable amount of engineering time is spent developing, running and analyzing these software simulation tests and their results. Desiring additional measures of design confidence, chip developers are increasingly turning to other methods of verification.

Another verification method is hardware emulation. Physical hardware, such as FPGAs, is configured to perform the same function as the design under test. Verification tests are then run against the hardware emulator to determine whether the current design functions as desired. An emulator is typically much faster—orders of magnitude faster—than a simulator. In addition, an emulator can also provide other valuable verification capabilities. For example, the emulator can be connected to other hardware that provides a real-world testing environment with real-world input data. The emulator also allows a verification engineer to run pseudo-random tests that cover many more pseudo-random scenarios than a simulator could handle. An emulator can also be connected to a simulator, which can be used to drive the emulator, simulate additional components, or in any combination. Most emulators can be connected simultaneously to a simulator and external physical devices.

However, failures in a verification test suite run on an emulator are more difficult to debug than failures in a verification test suite run on a simulator. A software simulator has known pre-determined input values that make the simulation results reproducible. An engineer typically can stop the software simulation on any cycle, single-step through simulation cycles and perform many other debugging activities.

In contrast, a hardware emulator may not always give reproducible results and typically has much more limited debug support. When the emulator detects a failure, it offers a narrow snapshot of previous activity because of the physical limitations of capturing signal values. A verification test that runs on an emulator for a few hours could spend billions of cycles before an error is detected. The emulator may offer a signal trace for the previous 1 million cycles but the root cause of the failure may have happened much earlier. In addition, an engineer may rerun the test and see different results. On the second run, the failure may not occur or the test may fail in an apparently different manner. Engineers frequently spends weeks debugging emulation failures. Even in situations where the tests performed on the emulator are repeatable, these tests can still span billions of cycles, leading to lengthy debug periods.

Engineers typically debug emulated designs by setting trigger conditions that cause the emulator to capture signal values when the trigger conditions are met. The engineers frequently rewrite the trigger conditions repeatedly until they capture signal values that reveal the root cause. Engineers would benefit greatly if the debugging of emulation failures could be improved.

SUMMARY

The present disclosure overcomes the limitations of the prior art by automatically generating properties from analysis of a first verification test suite, for direct use in a subsequent verification test suite.

For example, the first verification test suite may be a software simulation of an IP module and the second verification test suite may be a hardware emulation of a system-on-chip (SoC) containing the IP module. In such a case, the IP module may be verified first by executing the software simulation test suite. The resulting data is accessed and analyzed to detect a set of properties of the software simulation test suite. A set of emulator-synthesizable properties are selected from the set of detected properties. The emulator-synthesizable properties are suitable for incorporation in a hardware emulation test suite used to test the SoC. The selection of properties may be based on various factors, including the following: the relation between the software simulation test suite and the hardware emulation test suite (or between the IP module and the SoC), whether the property is synthesizable for the hardware emulator, and a maturity of the property or the software simulation test suite.

In one approach, properties are detected based on trace data for the software simulation. The trace data is a sequence of netlist node values recorded during a previous simulation of the IP module. A set of states are computed from the trace data. The states are logically analyzed to generate the set of properties. In one approach, the software simulation test suite is fairly complete, so the later hardware emulation should not traverse any states that were not previously traversed by the software simulation. A set of properties is generated, where the properties bound the states traversed by the software simulation. A violation of any of these properties by the hardware emulation test suite then indicates that the hardware emulation is traversing new states.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
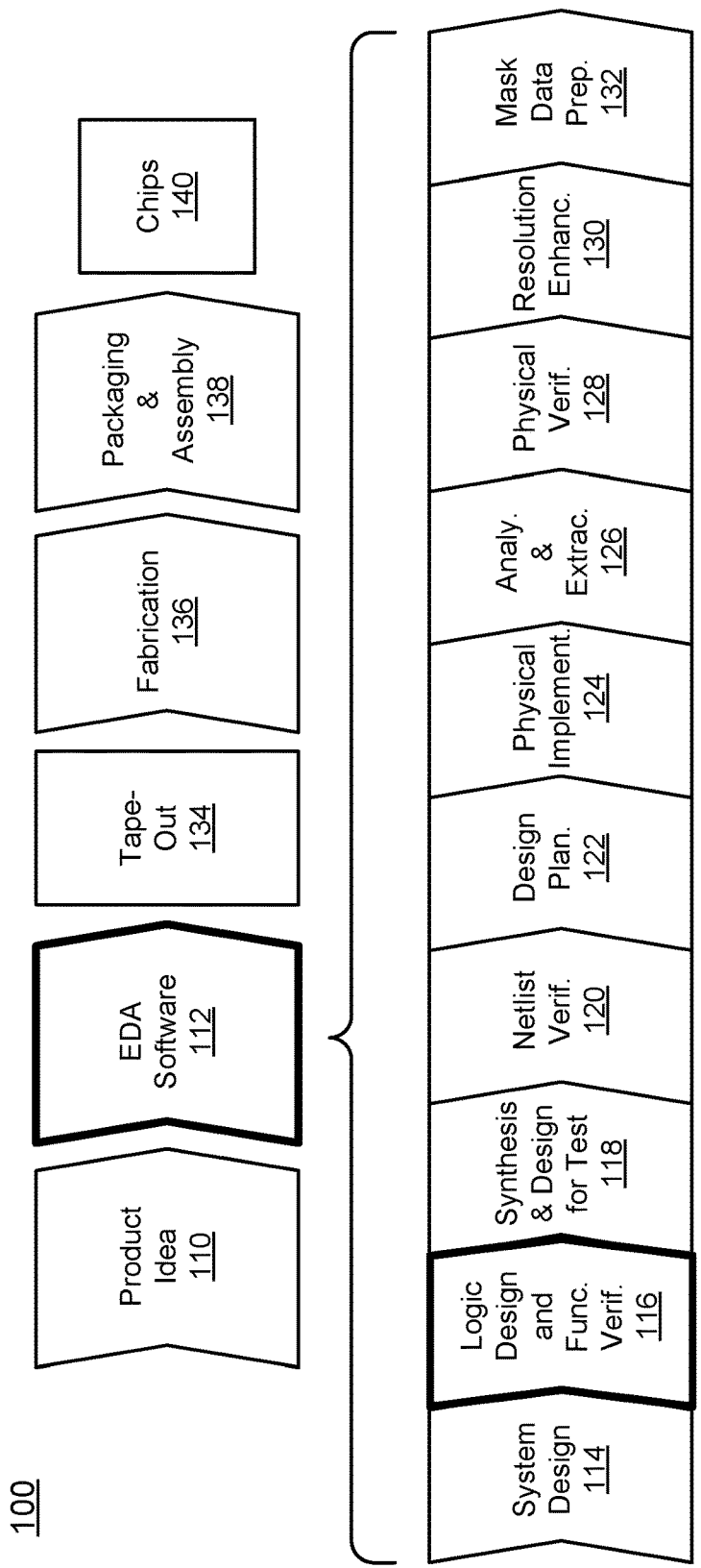
FIG. 1 is a flowchart illustrating various operations in the design and fabrication of an integrated circuit, according to an embodiment.

FIG. 1 is a flowchart illustrating various operations in the design and fabrication of an integrated circuit, according to an embodiment. The process starts with the generation of a product idea 110, which is realized during a design process 112 that uses electronic design automation (EDA) software. When the design is finalized, it can be taped-out 134. After tape-out, a semiconductor die is fabricated 136 to form the various features (e.g., gates, metal layers, vias) in the integrated circuit design. Packaging and assembly processes 138 are performed, which result in finished chips 140.

Note that the design process that uses EDA software 112 typically includes the operations 114-132, which are described below. This design flow description is for illustration purposes. This description is not meant to limit the present disclosure. For example, an actual integrated circuit design may require a designer to perform the design operations in a different sequence than the sequence described herein or to perform less than all of the design operations shown or to perform design operations in addition to those shown. In addition, many of the design operations are performed multiple times and/or performed iteratively as a design progresses, and may also be performed for different parts of the design.

During system design 114, designers describe the functionality to implement. They can also perform what-if planning to refine the functionality and to check costs. Hardware-software architecture partitioning can also occur at this stage. During logic design and functional verification 116, VHDL or Verilog code for modules in the circuit is written and the design is checked for functional accuracy. More specifically, the design is checked to ensure that it produces the correct outputs. During synthesis and design for test 118, VHDL/Verilog is translated to a netlist. This netlist can be optimized for the target technology. Additionally, tests can be designed and implemented to check the finished chips. During netlist verification 120, the netlist is checked for compliance with timing constraints and for correspondence with the VHDL/Verilog source code. During design planning 122, an overall floor plan for the chip is constructed and analyzed for timing and top-level routing.

During physical implementation 124, the placement (positioning of circuit elements) and routing (connection of the same) occurs. During analysis and extraction 126, the circuit function is verified at a transistor level, which permits refinement. During physical verification 128, the design is checked to ensure correctness for manufacturing, electrical issues, lithographic issues, and circuitry. During resolution enhancement 130, the layout undergoes lithographic simulations and geometric manipulations of the layout are performed to improve manufacturability of the design. During mask-data preparation 132, the "tape-out" data for production of masks to produce finished chips is provided.

The following examples are discussed in the context of functional verification 116. However, it should be understood that the principles described below may be applied to other steps in a design flow. Functional verification 116 can be accomplished using various techniques. In software-based simulation (also referred to as software simulation), specialized software is programmed to perform the same function as the design under test and then a test suite is executed on the software simulator. In some cases, software simulation is accelerated using specialized hardware. In hardware emulation, physical hardware, such as FPGAs, is configured to perform the same function as the design under test and then a test suite is executed on the hardware emulator. The design under test is the design for electronic circuitry (hardware), but it may also include the circuitry executing embedded and/or system-level software.

Figure 2C:
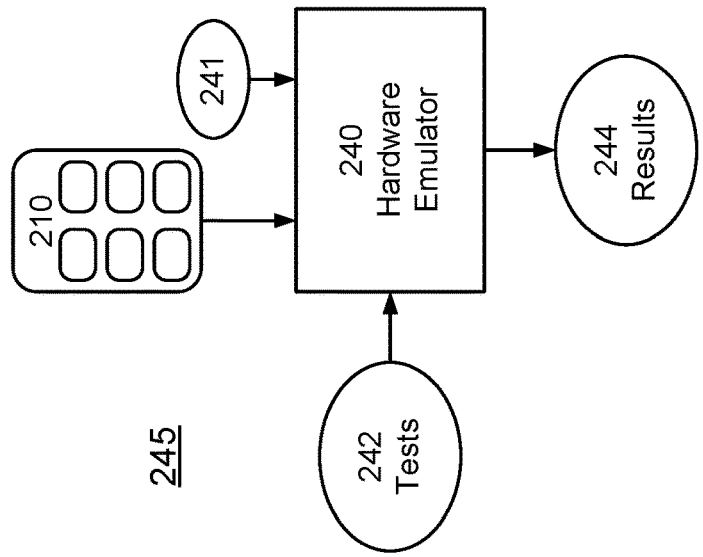
FIG. 2c is a diagram of hardware emulation of an SoC.
Figure 2B:
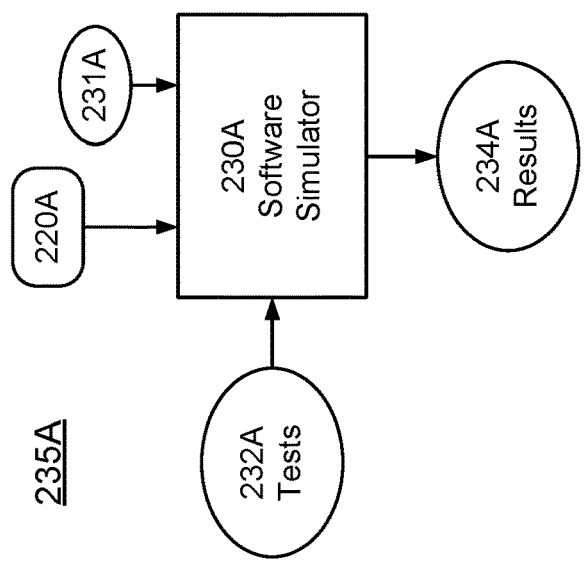
FIG. 2b is a diagram of software simulation of an individual IP module.
Figure 2A:
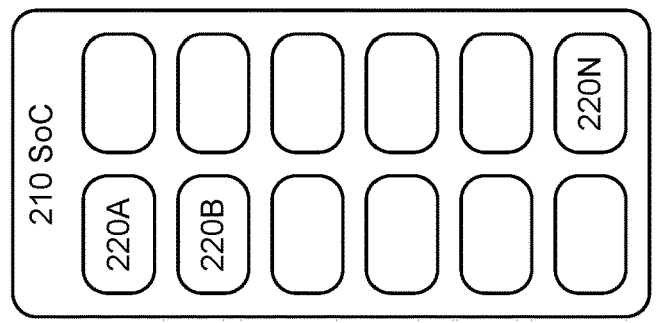
FIG. 2a is a block diagram of a system-on-chip that includes multiple IP modules.

FIGS. 2a-c are diagrams illustrating verification according to an embodiment. In this example, as shown in FIG. 2a, the integrated circuit to be designed is a system-on-chip (SoC) 210. The SoC 210 includes different components 220A-N which are often referred to as IP modules. Examples of IP modules 220 include processors (e.g., microprocessor, microcontroller, digital signal processor, video processor, audio processor, specialized co-processors, etc.) or components or functions of processors (e.g., Wallace tree, multiplier, BitBlit which is a graphics operation that merges two bit-map images, etc.), memories and memory management unit (including cache, flash controllers, content addressable memory, or other types of dedicated data storage), and input/output and communication components (e.g., USB, PCIE, I2C, SATA, wireless, Ethernet, peripherals drivers, etc.).

The IP modules 220 may be internally developed by the designer or licensed from third party IP providers. If they are licensed, the designer may have limited visibility and access to the internal electronic circuitry of the IP module 220, but may have behavioral or other models to simulate functionality of the IP module. FIG. 2a shows only one level of hierarchy—the SoC 210 includes multiple components 220. However, actual designs can include multiple levels of hierarchy. Each of the components 220 could have their own sub-components, and so on. Separate engineering teams may develop and test the different IP modules 220 used by the SoC 210, and yet another engineering team may be responsible for the overall SoC design. Some of the IP modules may be re-usable, re-configurable components that are used in multiple designs.

In the design of a complex SoC, the different design steps shown in FIG. 1 may occur at different levels. For example, verification could be performed separately on some or all of the IP modules 220. Verification could also be performed on the SoC 210 as a whole, which includes all of the IP modules 220. In one common approach, verification is performed on the separate IP modules 220 using a software simulator, and verification is performed on the SoC 210 using a hardware emulator. Simulation may be used on the IP modules because the IP modules are small enough that software simulation is feasible while providing the added advantages (e.g., visibility) of simulation. However, emulation may be preferred for the SoC 210 due to its size and complexity. Common formats for expressing the designs of the IP modules 220 and the SoC 210 include Verilog, VHDL and SystemVerilog.

This approach is shown in FIGS. 2b-2c. FIG. 2b shows software simulation 235A of IP module 220A. A simulator 230A is used to verify the functionality of IP module 220A. In addition to implementing the functionality of IP module 220A, the simulator 230A may also include instrumentation functionality 231A to assist in the debug process. Verification engineers generate simulation tests 232A to test the design of the IP module 220A. Input stimuli from the simulation tests 232A are provided to the simulator 230A, which generates corresponding test results 234A. This may be repeated many times over time as the design of the IP module 220A progresses and as the simulation tests 232A are improved. It may also be performed for each of the IP modules 220, each of which may be tested using different simulation tests 232 with corresponding test results 234.

FIG. 2c shows hardware emulation 245 of the SoC 210. The emulator 240 is configured to implement the functionality of SoC 210, which includes the IP modules 220. Test instrumentation 241 is also implemented in the emulator 240. The emulator 240 may be operated in conjunction with other computers, which may also include instrumentation. For example, during emulation, the emulator 240 may pass certain signals to another computer which checks whether trigger conditions have been met. Verification engineers generate tests 242 to test the design of the SoC 210. Input stimuli from the tests 242 are provided to the emulator 240, which generates corresponding test results 244. The test suite can include software to be executed on the emulated design under test.

The emulation tests 242 and the instrumentation and configuration of the emulator 240 could be developed from scratch. However, this would be a long and time-consuming process. It would be beneficial if knowledge gained from the component simulations of FIG. 2b could be automatically incorporated into the emulation of FIG. 2c.

Figure 3:
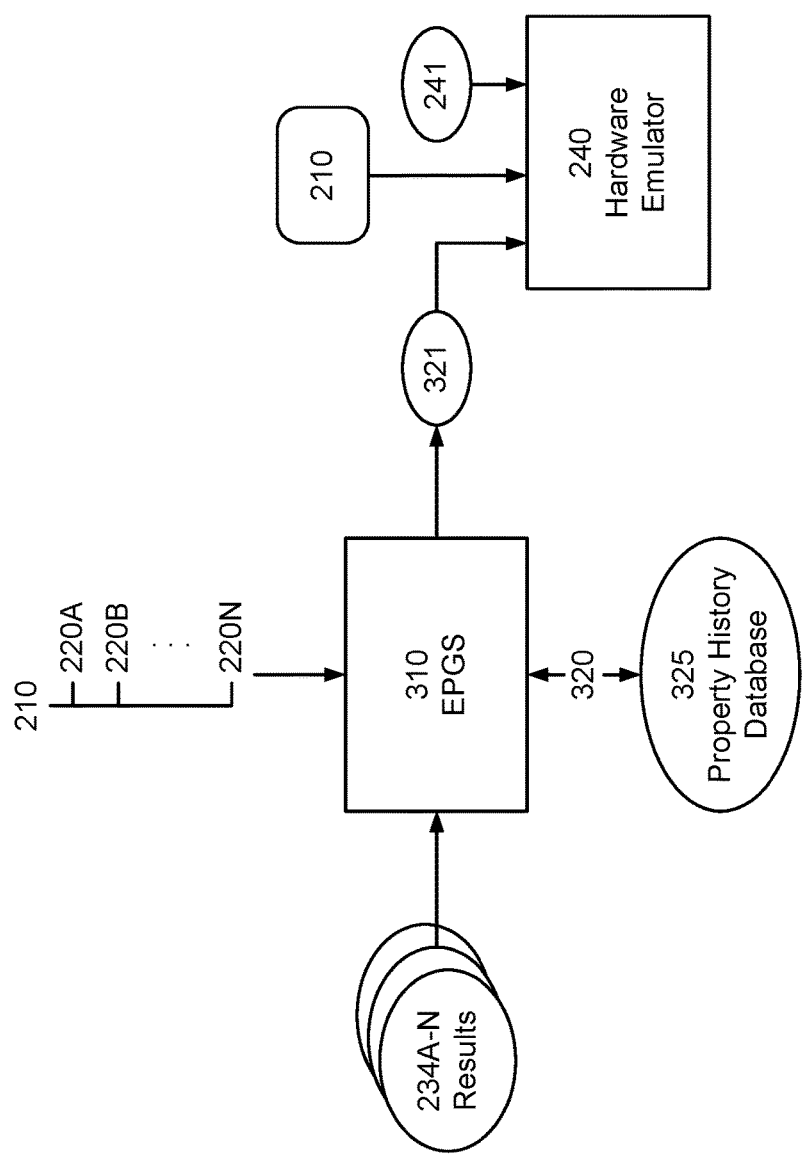
FIG. 3 illustrates operation of an Emulation Property Generator System.

FIG. 3 illustrates operation of an Emulation Property Generator System (EPGS) 310, which automatically generates properties from previously executed software simulation test suites to aid in emulator debugging. The detected properties can be directly incorporated in the hardware emulation test suite as additional instrumentation, without designer review. The properties trigger the emulator to stop and/or trace signals values when the conditions in the property are violated. Experience has shown that many emulation failures can be quickly diagnosed using this technique. A property violation indicates a departure from expected behavior.

In one embodiment, the EPGS 310 runs as an application program on a central processing unit (CPU). The EPGS 310 interacts with a user through an input device and a display. In another approach, the EPGS 310 is encapsulated as an application within an EDA tool chain. In another embodiment the EPGS 310 is encapsulated as a software module within another EDA application program.

Figure 4:
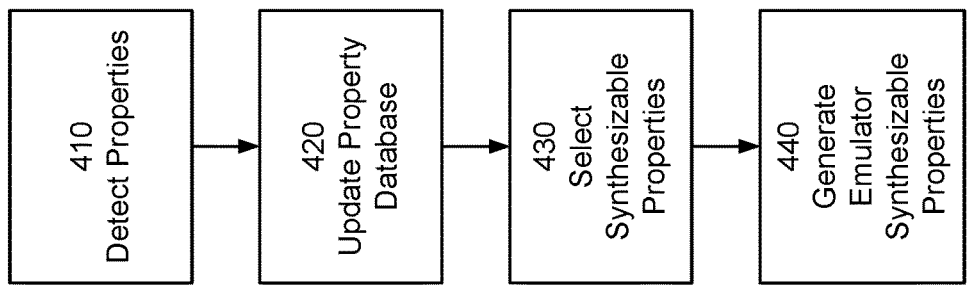
FIG. 4 is a flowchart of a method for generating emulator-synthesizable properties.

As shown in FIG. 3 and in the flowchart of FIG. 4, the EPGS 310 accesses the simulation test results 234 for the IP module level tests, and possibly also accesses other parts of the software simulation test suites, such as the designs for the IP modules. The EPGS 310 then automatically detects 410 properties 320 from the simulation test results 234. The EPGS may also read the RTL designs of the IP modules and detect properties by analyzing the design. In one embodiment the EPGS uses properties detected from the design and does not use test results. In a different embodiment the EPGS uses properties detected from the test results and does not use properties detected from the design. In yet another embodiment, the EPGS uses both properties detected from the test results and properties detected from the design.

These properties 320 may be saved 420 in a property history database 325. The EPGS updates 420 the property history database 325. The EPGS stores the detected properties and the time and date they were detected, in this way there is a history of which properties have been detected on which date.

The EPGS 310 selects 430 a set of properties from the database 325 for incorporation into the hardware emulation test suite. The selected properties preferably are mature stable properties, which may be determined by the property history in database 325. In another approach, the EPGS 310 selects a set of emulator-synthesizable properties 321 directly from detected properties without using a property history database 325. Regardless, the properties 321 are selected 430 based in part on a relation between the SoC 210 and the underlying components 220. In this example, the EPGS 310 also accesses the SoC design 210, which shows which and how individual components 220 are used in the SoC design 210. Based on the relation, the EPGS 310 determines which of the properties that apply to individual IP modules 220 are also likely to apply to the SoC 210.

Selection 430 is also based on which properties can be implemented by the hardware emulator. The selected properties 321 should be implementable by the hardware emulator. The EPGS 310 filters out 430 properties that cannot be synthesized by the emulator, properties that a user has marked to ignore, negates coverage conditions and then outputs 440 the list of emulator-synthesizable properties. Common output formats for expressing properties include SystemVerilog Assertions (SVA), Property Specification Language (PSL), and Open Verilog Library (OVL).

The set of emulator-synthesizable properties 321 are additional instrumentation for the emulator. That is, the emulator 240 is configured based on the SoC design under test 210, the emulator-synthesizable properties 321 and any other desired instrumentation 241. The emulator-synthesizable properties 321 may be stored in files for later use in configuring the emulator.

When the hardware emulation test suite is executed, the emulator 240 is then instrumented to detect a violation of an emulator-synthesizable property 321. When the emulator detects a property violation, a verification engineer may debug the failure using signal trace information triggered by the property violation.

In more detail, a property declares a condition in a design. If a property always holds true, it is referred to as an assertion. For example, a property "overflow==1'b0" should always hold for any correct FIFO design. On the other hand, a property can also capture possible behavior allowed by the design. Such a property is referred to as a coverage property. For example, a property "full==1'b1" can be a typical coverage property on the same FIFO design. The above two examples are typically written as:

assert overflow==1'b0
    cover full==1'b1

Properties are typically written in languages such as System Verilog Assertions (SVA), Property Specification Language (PSL) or Open Verilog Library (OVL). Atrenta's Bugscope EDA tool is an example of a tool that generates properties by analyzing simulation test results. Further examples are described in U.S. patent application Ser. No. 13/672,537, "Systems and Methods for Generating Predicates and Assertions," which is incorporated herein by reference in its entirety.

Most emulators will accept SVA (or other) properties so long as the SVA is written using a synthesizable subset of the language. The emulator implements the circuit design and properties using synthesized logic that maps to the emulation hardware. Not all properties can be synthesized to run on the emulation hardware. The EPGS generates only the properties that can be synthesized to run on the emulation hardware.

In one approach, the EPGS generated properties represent the conditions under which a design has been previously tested by one of the software simulation test suites. Examples of generated properties include the following:

!(pci_config[2:1]==2'b11 && pci_config[9:8]==2'b00)
    data_start|->r_state==IDLE
    r_state !=ABORT_STATE The first example indicates that the configuration of PCI follows some basic rules. Certain combinations are not tested in the software simulation test suite. The second example indicates that the data transaction can only start when the finites state machine is at idle state. This is typically a state machine assumption in order to move correctly. The final example indicates that ABORT behavior is not tested in the software simulation test suite. If this is true for testing of the IP module, then at the SoC/emulation level, this should not be tested either. If it is tested, the property is violated and should be flagged as a possible error.

Referring to FIG. 2b, for each software simulation test suite 235A, the IP module 220A can be represented by a set of variables XA={xA1, xA2, . . . , xAk}, such as the values stored in registers in the IP module 220. At any point in the simulation, the set of variables XA defines a state for the simulation test suite. As the simulation 235 runs, the IP module traverses different states XA. In one particular approach, the variables xA are values of nodes in the netlist for the design, and the sequence of states XA is then sometimes referred to as a trace of the simulation.

If the simulation test suite is fairly complete, then it should traverse all or almost all states XA of interest. This will be true for all of the IP modules 220A-N. That is, the simulations 235A of IP module 220A should traverse a fairly complete set of state spaces {XAi} where i is an index for the state spaces. The simulations 235B of IP module 220B should traverse a fairly complete set of states spaces {XBi}, and so on.

If each of the separate simulations of the individual IP modules 220 is fairly complete, then the emulation 245 of the SoC 210 should not reach states beyond those already reached during the simulations 235. Therefore, properties which are detected for the simulations 235 should also apply to the emulation 245.

Figure 5B:
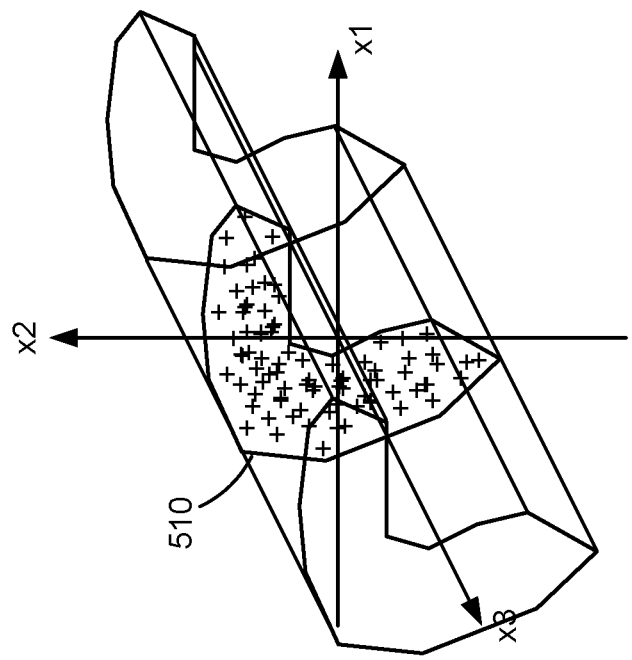
FIG. 5b is a diagram of a state space that may be traversed by a hardware emulation of an SoC.
Figure 5A:
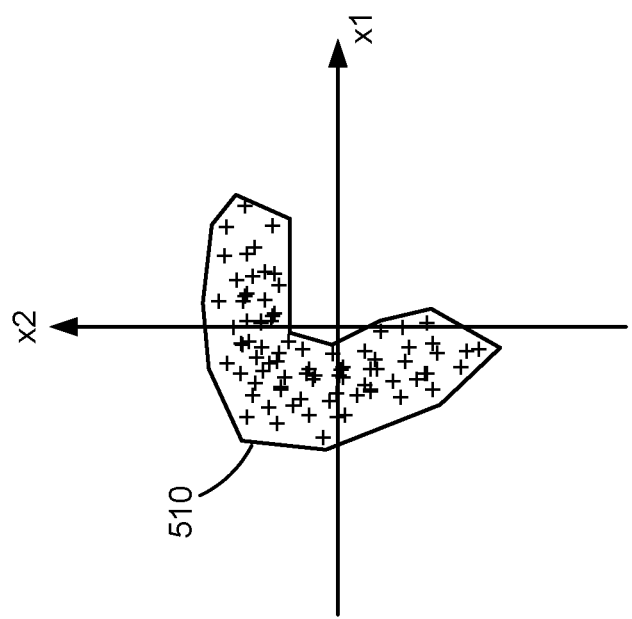
FIG. 5a is a diagram of a state space traversed by a software simulation of an IP module.

FIGS. 5a-b show this graphically. FIG. 5a represents the software simulation test suite of an IP module 220A. The coordinates {x1,x2} represent the state space of the IP module 220A. The different +'s in FIG. 5a are the non-error states that were reached during the simulations. These states are computed from the trace data for the software simulation test suite. The boundary 510 around the +'s is defined by properties detected by the EPGS. These properties are determined by logically analyzing the set of states +. None of the +'s violates any of the properties. In addition to the examples given above, the following are some additional examples of properties:

interleave (req, ack)
    !(read & write)
    valid |->@valid==0

Now consider FIG. 5b. FIG. 5b represents the hardware emulation test suite of an SoC that includes IP module 220A and another IP module that adds variable x3. However, if the previous simulation of IP module 220A is fairly complete, then the emulation of the SoC will not reach states outside the boundary 510. The state space to be traversed by the hardware emulation test suite will be a subset of the state space already traversed by the software simulation test suite. Thus, the properties defining the boundary 510 should also apply to the hardware emulation test suite. They can be added as instrumentation to the emulation of the SoC to detect violation of a property. In some sense, the boundary 510 defined by properties describes the "normal" state of operation and, therefore, any states reached outside the boundary are flagged as possibly an error. A similar approach can also be taken for the other IP module, but this is omitted from FIG. 5b for clarity.

As an example, assume that the EPGS detects a coverage property "cover counter <=4'b7" if a 4-bit counter never assumes a value greater than 7 in any of the simulations 235. The EPGS generates a property telling the emulator to stop and/or start a trace whenever the value of the counter exceeds 7. The EPGS negates the coverage property condition before generating a property for the emulator. Violating this property informs the emulation engineer that the emulation 245 is executing a scenario that has not been tested during simulation 235. There is a high probability that previously untested scenarios will show a bug, either in the design, in the configuration of the emulator or in the simulation test suites.

The verification engineer reviews emulation property violations and decides if there is a design bug. If the property violation does not cause a bug, the verification engineer must decide what to do. The verification engineer can develop more simulation tests to cover this unexpected scenario or the verification engineer can tell the EPGS to ignore this specific property.

This approach of applying generated properties in the emulator, usually works better when there is a mature simulation test suite. The EPGS maintains a property history database to allow it to ascertain the maturity of detected properties and the maturity of the test suite. In one approach, the EPGS tests the maturity of individual properties by determining for how long they have been detected. For example, a property that has been detected every week for the last 6 weeks may be considered a mature property. The EPGS tests the maturity of the test suite by measuring how many changes to the detected properties occur each week as new tests are added to the simulation test suite.

The EPGS generates emulator-synthesizable properties. The EPGS detects properties by analyzing the design and by capturing and analyzing the simulation test results. The EPGS tests the maturity of the detected properties by analyzing and maintaining a property history database. The EPGS generates properties that can be used directly by an emulator.

Although the detailed description contains many specifics, these should not be construed as limiting the scope of the invention but merely as illustrating different examples and aspects of the invention. It should be appreciated that the scope of the invention includes other embodiments not discussed in detail above. For example, the invention is not limited to generating properties from previously executed software simulations in order to assist a later hardware emulation. Any types of verification can be used. Properties can be generated from previously executed software simulations, previously executed hardware emulations or combinations of the two. The resulting properties can be incorporated in later software simulations, hardware emulations or combinations of the two. Verification types other than software simulation and hardware emulation can also be used.

As another example, with respect to the designs under test, the invention also is not limited to the relationship of component and system, or of IP module and SoC. It could be the design of the same electronic circuit but using different verification types. Alternately, a fairly complete verification test suite may be developed at the system level first, and the techniques described here can then be used to automatically generate properties to be incorporated into verification test suites for components of the system.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A system for assisting in generation of a hardware emulation test suite for verifying a design under test by a hardware emulator, the system comprising:
    a properties database that stores properties automatically detected from previously executed verifications of prior designs of electronic circuitries, the properties declaring conditions in the prior designs; and
    an emulation property generator system coupled to the properties database, wherein the emulation property generator system:
    accesses the design under test; and
    selects from the properties database a set of properties for incorporation into the hardware emulation test suite, the set selected based on a relation of the design under test to the prior designs and also selected based on whether properties are synthesizable for the hardware emulator.

2. The system of claim 1, wherein the emulation property generator system further creates test instrumentation for verifying the design under test with respect to the selected set of properties.

3. The system of claim 2, wherein the test instrumentation triggers the hardware emulator to stop verification of the design under test, based on a condition in the selected set of properties.

4. The system of claim 2, wherein the test instrumentation triggers the hardware emulator to trace signal values in the design under test, based on a condition in the selected set of properties.

5. The system of claim 2, wherein the test instrumentation detects a violation of one or more properties in the selected set.

6. The system of claim 1, wherein the emulation property generator system selects the set of properties further based on a maturity of the properties.

7. The system of claim 1, wherein the properties database is a property history database that also stores a history of the automatically detected properties in the database, and the emulation property generator system selects the set of properties further based on the stored history of the properties.

8. The system of claim 1, wherein the design under test is a system-on-chip that includes one or more IP modules, and the selected set of properties includes properties for the one or more IP modules.

9. The system of claim 8, wherein the properties database stores properties automatically detected from previously executed software simulations of models of the one or more IP modules.

10. The system of claim 1, wherein the design under test includes one or more component modules, and the selected set of properties includes properties for the one or more component modules.

11. The system of claim 1, wherein the properties database stores properties automatically detected from previously executed software simulations of the prior designs.

12. The system of claim 1, wherein the emulation property generator system comprises an application program executing on a processor separate from the hardware emulator.

13. The system of claim 1, wherein the emulation property generator system is an electronic design automation (EDA) tool used in a design flow for the design under test.

14. The system of claim 1, wherein the emulation property generator system is encapsulated as a module within an EDA tool used in a design flow for the design under test.

15. The system of claim 1, wherein the properties stored in the properties database include assertions.

16. The system of claim 1, wherein the properties stored in the properties database include coverage properties.

17. The system of claim 1, wherein one or more of the properties stored in the properties database were automatically detected by analyzing the prior designs.

18. The system of claim 1, wherein one or more of the properties stored in the properties database were automatically detected by analyzing results of the previously executed verifications.

19. The system of claim 1, further comprising:
a hardware emulator configured to implement test instrumentation that detects violation of the selected properties during verification of the design under test.

20. A system for assisting in generation of a hardware emulation test suite for verifying a design under test by a hardware emulator, the design under test including one or more component modules, the system comprising:
a properties database that stores properties automatically detected from previously executed software simulations of the one or more component modules, the properties declaring conditions in the prior designs; and
an emulation property generator system coupled to the properties database, wherein the emulation property generator system:
accesses the design under test;
selects from the properties database a set of properties for incorporation into the hardware emulation test suite, the selected set of properties including properties for the one or more component modules, the set also selected based on whether properties are synthesizable for the hardware emulator; and
creates test instrumentation for verifying the design under test with respect to the selected set of properties, wherein the test instrumentation detects a violation of one or more properties in the selected set.

21. The system of claim 20, wherein the one or more component modules includes one or more IP modules, and the properties database stores properties automatically detected from previously executed software simulations of models of the one or more IP modules.

* * * * *